(12) United States Patent
Rovito et al.

(10) Patent No.: US 9,024,899 B2
(45) Date of Patent: May 5, 2015

(54) MULTI-TOUCH PROBE ACTUATOR

(71) Applicant: Microsoft Corporation, Redmond, WA (US)

(72) Inventors: Joe Rovito, Snoqualmie, WA (US);
Arun Mathew, Redmond, WA (US);
Mike Ma, Redmond, WA (US); Michael Friedman, Seattle, WA (US); Dave Orvis, Seattle, WA (US)

(73) Assignee: Microsoft Technology Licensing, LLC

( * ) Notice: Subject to any disclaimer, the term of this patent is extended or adjusted under 35 U.S.C. 154(b) by 177 days.

(21) Appl. No.: 13/802,640

(22) Filed: Mar. 13, 2013

(65) Prior Publication Data

US 2014/0278187 A1 Sep. 18, 2014

(51) Int. Cl.
*G06F 3/041* (2006.01)
*G01R 31/28* (2006.01)

(52) U.S. Cl.
CPC .......... *G01R 31/2829* (2013.01); *G06F 3/0418* (2013.01)

(58) Field of Classification Search
None
See application file for complete search history.

(56) References Cited

U.S. PATENT DOCUMENTS

| 7,742,036 | B2 | 6/2010 | Grant et al. | |
|---|---|---|---|---|
| 2011/0055729 | A1* | 3/2011 | Mason et al. | 715/753 |
| 2012/0146956 | A1 | 6/2012 | Jenkinson | |
| 2012/0188176 | A1 | 7/2012 | Uzelac et al. | |
| 2012/0280934 | A1 | 11/2012 | Ha et al. | |
| 2013/0234977 | A1* | 9/2013 | Lin et al. | 345/174 |
| 2014/0160037 | A1* | 6/2014 | Soelberg | 345/173 |
| 2014/0168100 | A1* | 6/2014 | Argiro | 345/173 |

OTHER PUBLICATIONS

"ShopBot User Guide", Retrieved at <<http://www.shopbottools.com/files/docs/SBG00142080923UserGuide.pdf>>, Mannual, ShopBot Tools, Inc., 2008, pp. 77.
Wang, et al., "Design and Test of a Girder Control System at NSRRC", Retrieved at <<http://accelconf.web.cern.ch/accelconf/icalepcs2011/papers/mopks012.pdf>>, 13th International Conference on Accelerator and Large Experimental Physics Control Systems, Oct. 10, 2011, pp. 3.
Williams, et al., "Automated Positioning and Alignment Systems", Retrieved at <<http://www.aint.com/pdfs/Positioning%20Alignment%20White%20Paper.pdf>>, Technical Paper, Society of Automotive Engineers, Inc., Sep. 19, 2000, pp. 9.

(Continued)

*Primary Examiner* — Muhammad N Edun
(74) *Attorney, Agent, or Firm* — Sarah Lee; Kate Drakos; Micky Minhas

(57) ABSTRACT

Example apparatus and methods concern automated testing of a capacitive touch interface (e.g., touch screen). One example apparatus includes probes that extend and retract from the apparatus under programmatic control. The probes produce a capacitive touch response on a capacitive touch interface. The example apparatus includes logics configured to control touch testing of the interface using the probes. A first logic may provide a closed loop vision system for controlling the position of the interface relative to the apparatus. A second logic may calibrate a co-ordinate system associated with the apparatus and a co-ordinate system associated with the interface so that the apparatus may function in the pixel space of the interface being tested. A third logic may control the probes to test the interface by producing a series of touches, multi-touches, or gestures on the interface.

20 Claims, 11 Drawing Sheets

(56) References Cited

OTHER PUBLICATIONS

Schrader, et al., "Application of a Touch-Probe Array for the Parallel Measurement of Microstructures", Retrieved at <<http://www.ama-science.org/home/getFile/ZwD3>>, 16th International Trade Fair for Sensorics, Measuring and Testing Technologies with Concurrent Conferences, May 28, 2009, pp. 5.

"International Search Report & Written Opinion for PCT Patent Application No. PCT/US2014/020451", Mailed Date: Jul. 7, 2014, Filed Date: Mar. 5, 2014, 8 Pages.

* cited by examiner

MULTI-TOUCH PROBE ACTUATOR

BACKGROUND

Capacitive touch interfaces are in use on an ever increasing number and variety of devices including tablet computers and smart phones. Conventional manual testing for capacitive touch interfaces may have been limited by the availability, accuracy, speed, and throughput of a skilled operator. Conventional manual testing may also have produced inconsistent force/displacement profiles, either within a population of testers, or even within a single tester as the tester became physically or mentally fatigued. Conventional automated or robotic testing for capacitive touch interfaces may have similarly been limited by accuracy and speed issues, but also by inconsistent force/displacement profiles, calibration and registration issues, and the cost of robotic testers. Additionally, conventional automated or robotic testing for capacitive touch interfaces may have experienced issues associated with substituting simulated touch events for actual touches. Conventional automated or robotic devices may have been single touch devices that performed slower than manual testers and that did not provide true end-to-end testing. Thus, capacitive touch screen interface testing has suffered from slow, inaccurate, and expensive testing that may not have produced true end-to-end testing.

Conventional general purpose robots may provide a flexible, programmable positioning system that excels at moving devices in a large three dimensional envelope at arbitrary attack angles. These general purpose robots may provide highly repeatable actions at fast speeds with coordinated motions. These attributes, while desirable for certain applications, may make conventional general purpose robots inappropriate for high accuracy touch testing of capacitive touch interfaces.

SUMMARY

This Summary is provided to introduce, in a simplified form, a selection of concepts that are further described below in the Detailed Description. This Summary is not intended to identify key features or essential features of the claimed subject matter, nor is it intended to be used to limit the scope of the claimed subject matter.

Example apparatus, programmed computer readable media, and methods provide accurate, high-speed, repeatable, automated, end-to-end touch testing for capacitive touch screen interfaces. In addition to multi-touch testing, example apparatus and methods may provide gesture touching including drags, flicks, holds, taps, double taps, hovering, and other gestures.

Example apparatus may be configured with a camera that facilitates operating the apparatus under closed loop position control. Closed loop position control may facilitate calibrating the apparatus to within a tolerance that facilitates producing an accurate mapping between the co-ordinate systems of the apparatus and the device under test. Being able to map the two co-ordinate systems allows the apparatus to operate in the pixel-space of the device under test, which facilitates testing different interfaces on different devices using a single tester. Example calibration methods may use a dual-color, split-screen, binary search approach.

Example apparatus may have the plurality of actuators and probes arranged in a pattern where a probe is equidistant from other adjacent probes. In one example, the pattern may be a honeycomb pattern. The actuators and probes may be arranged to facilitate reducing or minimizing the amount of x/y travel required to position a probe at a desired point to touch on the device under test. Reducing or minimizing the x/y travel time facilitates increasing the number of touches that can be achieved in a period of time.

Example apparatus may be manufactured from a single printed circuit board (PCB) that provides multiple layers from which the apparatus is assembled. The layers may include two layers that include openings for the actuators or probes. The PCB and the openings in the at least two layers may be manufactured to within a tolerance that facilitates guiding and controlling the direction of travel of the probes and actuators without additional bushings or bearings.

BRIEF DESCRIPTION OF THE DRAWINGS

The accompanying drawings illustrate various example apparatus, methods, and other embodiments described herein. It will be appreciated that the illustrated element boundaries (e.g., boxes, groups of boxes, or other shapes) in the figures represent one example of the boundaries. In some examples, one element may be designed as multiple elements or multiple elements may be designed as one element. In some examples, an element shown as an internal component of another element may be implemented as an external component and vice versa. Furthermore, elements may not be drawn to scale.

DETAILED DESCRIPTION

Example multi-touch probe actuators facilitate exercising and testing hardware and software associated with a capacitive touch interface (e.g., touch screen) on a computing device (e.g., tablet, phone, wearable computing devices such as glasses). An example apparatus includes an array of touch probe actuators configured to independently control the speed and force with which members of a corresponding array of touch probes are moved to contact the capacitive touch interface (or hover proximate the capacitive touch interface). A camera (or similar image capture sensor) and calibration logic facilitates accurately positioning the device under test and the apparatus so that the apparatus can operate in the pixel space of the device under test to within a desired pixel tolerance.

Being able to independently control members of the array of touch probes to touch or not touch the capacitive touch interface under programmatic control improves the speed, accuracy, throughput, and repeatability of touch interface testing. This improved speed, accuracy, throughput, and repeatability facilitates testing capacitive touch interfaces using stress, reliability, and performance scenarios that may have been difficult, if even possible, to attain with conventional approaches.

Figure 1:
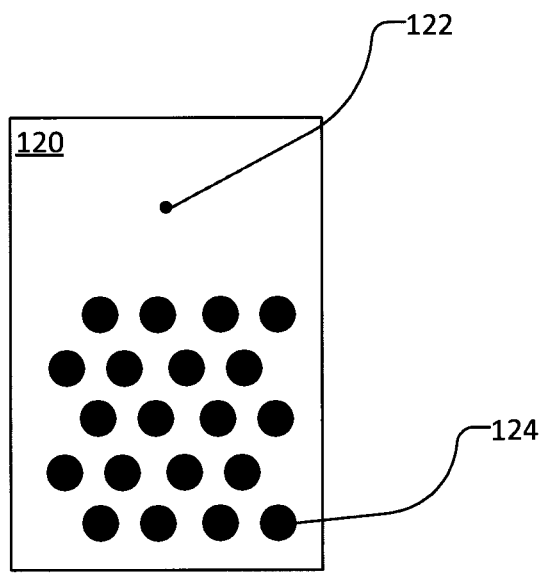
FIG. 1 illustrates a top view of an example multi-touch probe actuator.

FIG. 1 illustrates a top view of an example multi-touch probe actuator 120. The actuator 120 may be constructed from multiple layers of PCBs. In one embodiment, the multiple layers are all taken from a single PCB. Only the top layer of actuator 120 is visible in FIG. 1. The top layer includes an aperture 122. A camera positioned below the top layer of actuator 120 may be able to capture light that passes through the aperture 122. The light would come, for example, from the screen of a device under test positioned over or on the top layer of actuator 120.

The top layer also includes a number of holes 124. In one embodiment, the aperture 122 and the holes 124 in the top layer of actuator 120 are manufactured at known positions to within a tolerance that facilitates registration and calibration as described below.

Actuator 120 is configured with machinery and electronics that facilitate pushing probes through holes 124 and retracting the probes back through holes 124. The plurality of actuators and probes may be arranged in a pattern so that a probe is equidistant from other adjacent probes. In one example, the pattern may be a honeycomb pattern. In another example, the pattern may be application specific and designed to test a particular device and a particular interface in a particular way. Thus, in one embodiment, the top layer of actuator 120 may be easily removed and replaced with a different top layer with an appropriate pattern.

Since the actuators and probes may be arranged in precise patterns, the holes 124 are also arranged in a precise pattern. In one embodiment, the actuators, probes, and holes 124 may be arranged to facilitate reducing or minimizing the amount of two dimensional (e.g., x/y) travel required to position a probe at a desired point to touch on the device under test. In this embodiment, the holes 124 may be arranged so that a hole is equidistant from all other immediately adjacent holes. Reducing or minimizing the x/y travel time facilitates increasing the number of touches that can be achieved in a period of time.

Figure 2:
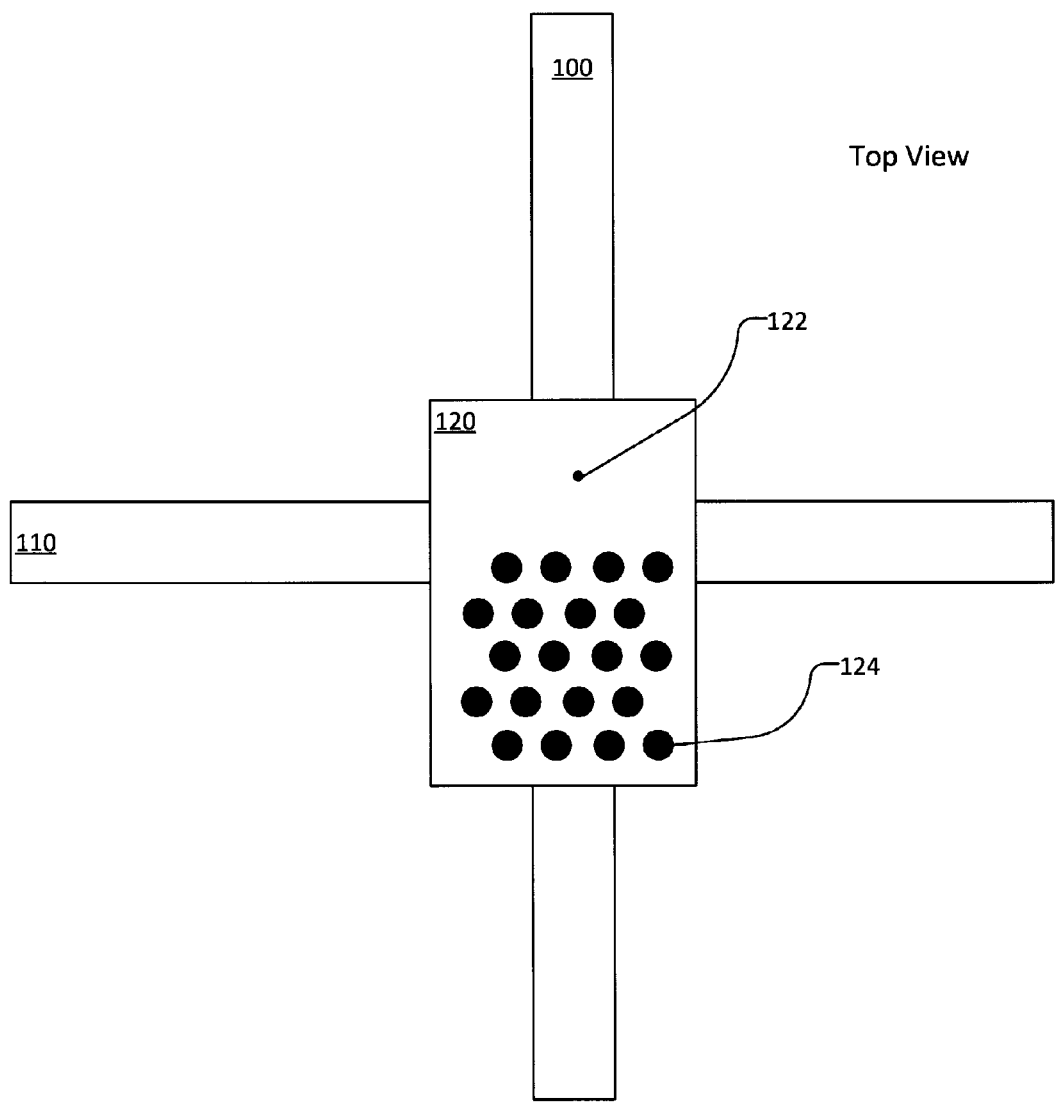
FIG. 2 illustrates a top view of an example multi-touch probe actuator positioned on an x/y positioning apparatus.

FIG. 2 illustrates a top view of an example multi-touch probe actuator 120 positioned on an x/y positioning apparatus. More generally, the x/y positioning apparatus is a two dimensional positioning apparatus. The x/y positioning apparatus includes an x positioning apparatus 110 and a y positioning apparatus 100, where x refers to a horizontal motion and y refers to vertical movement. In different embodiments, x positioning apparatus 110 and y positioning apparatus 100 may be screw driven apparatus, stepper motor apparatus with open loop control, stepper motor apparatus with linear encoder control, servo motor apparatus with closed loop rotary encoder control, servo motor with closed loop rotary encoder and linear encoder control, or other apparatus. While separate x positioning 110 and y positioning 100 apparatus are illustrated, and while the positioning apparatus are illustrated as linear tracks in the horizontal and vertical planes, other positioning apparatus arranged in different planes and configurations may be employed. In one embodiment, actuator 120 may be moved by the x/y positioning apparatus. In another embodiment, a device under test may be moved by the x/y positioning apparatus. The x/y positioning apparatus is configured to facilitate relative movement in two dimensions between the actuator 120 and a device under test.

Figure 3:
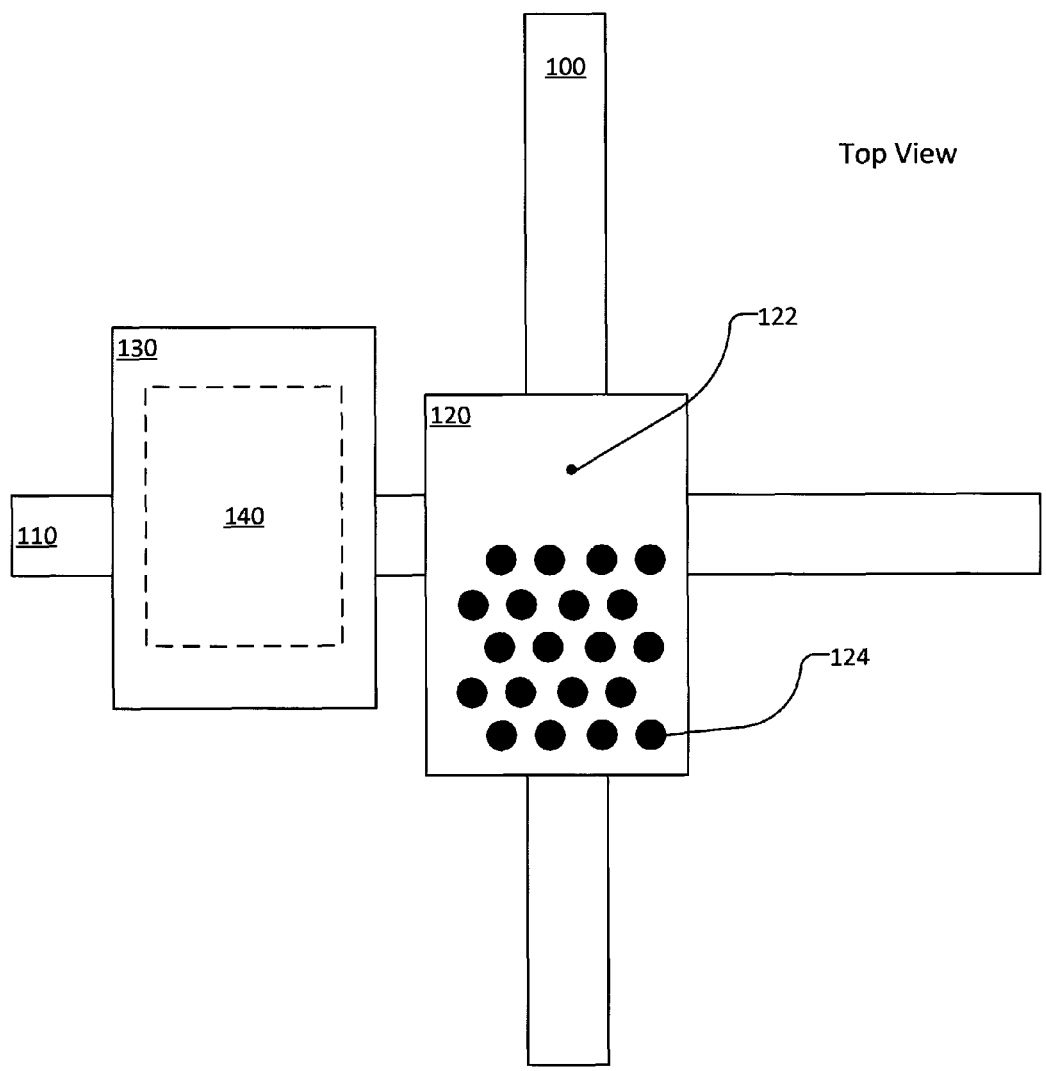
FIG. 3 illustrates a top view of an example multi-touch probe actuator positioned on an x/y positioning apparatus, and a device under test.

FIG. 3 illustrates a top view of an example multi-touch probe actuator 120 positioned on an x/y positioning apparatus, and a device under test 130. In one embodiment, actuator 120 may include equipment (e.g., clamp) for holding the device under test 130 in a secure position. The clamp or other holding equipment may hold the device under test 130 in a static position. In another embodiment, actuator 120 may include an enclosure for holding the device under test 130 in a secure or static position. Device under test 130 has a capacitive touch screen 140. The lines for capacitive touch screen 140 are dashed to indicate that the touch screen 140 is positioned facing actuator 120 and away from a viewer of FIG. 3. Device under test 130 may be, for example, a smart phone, a tablet, or other device that has a capacitive touch screen or other capacitive touch interface. In different embodiments, the x/y positioning apparatus may be engaged to move the device under test 130 over the actuator 120 or to move the actuator 120 under the device under test 130. In other embodiments, relative motion between the actuator 120 and the device under test 130 may be achieved in other ways. The x/y positioning apparatus may be controlled by a closed loop vision system. The closed loop vision system may process light that is produced by screen 140 and detected by a camera positioned under aperture 122. The camera may be, for example, a close focus, high definition (HD) camera. Thus, a first rough positioning may be achieved when a camera under aperture 122 detects a threshold amount of light from screen 140. A more precise positioning, calibration, and registration is described below.

Figure 4:
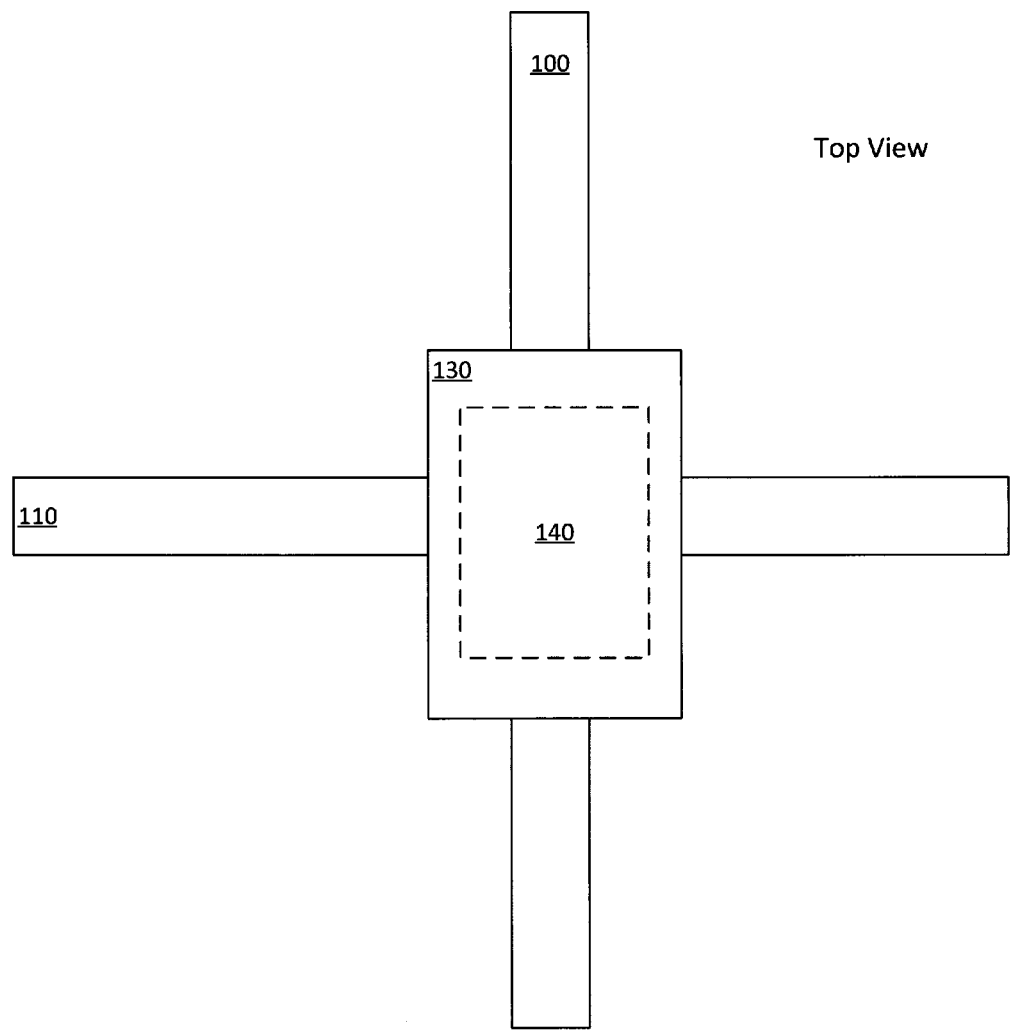
FIG. 4 illustrates a top view of a device under test positioned over an example multi-touch probe actuator positioned on an x/y positioning apparatus.

FIG. 4 illustrates a top view of a device under test 130. Since device under test 130 has been moved relative to the actuator, the actuator is no longer visible in the top view presented in FIG. 4. The lines for capacitive touch screen 140 are dashed to indicate that the touch screen 140 is positioned facing the actuator and away from a viewer of FIG. 4.

Figure 5:
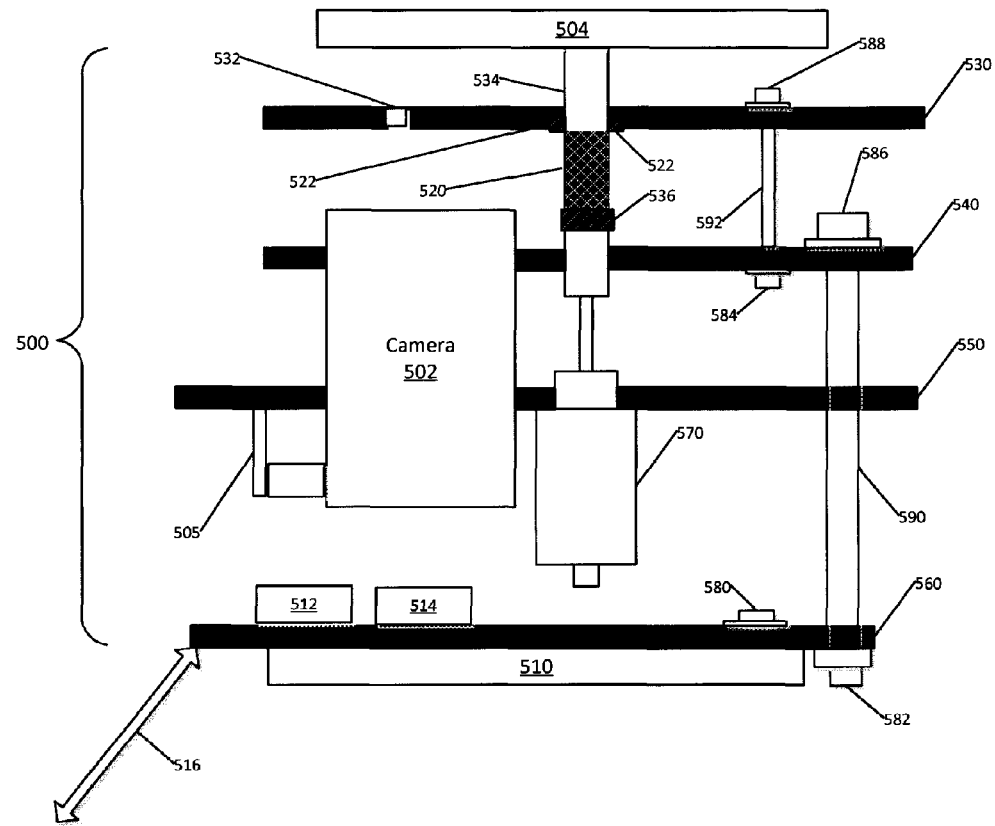
FIG. 5 illustrates a side view of a portion of an example apparatus configured to perform multi-touch testing of a capacitive touch interface.

FIG. 5 illustrates a side view of a portion of an example apparatus 500 that is configured to perform multi-touch testing of a capacitive touch interface on a device under test 504. The capacitive touch interface may be, for example, a touch screen on a smart phone, a touch screen on a tablet computer, a touch screen on a laptop computer, or other device. Apparatus 500 includes a probe 534 that is illustrated in an extended position where the probe 534 touches the capacitive touch interface on the device under test 504. In one embodiment, the probe 534 may be a brass cylinder of 7 mm diameter. Other probes that produce the capacitive response on the interface may be employed. While a single probe 534 is illustrated, apparatus 500 may have multiple probes. In one embodiment, apparatus 500 may have 32 probes that are arranged in a honeycomb pattern.

Apparatus 500 may be mounted, for example, on a table 510 or other suitable platform or supporting structure. Mounting or positioning apparatus 500 on a table 510 or other platform fixes the apparatus 500 in the third (e.g. z) dimension while allowing movement in the other two dimensions (e.g., x, y). Similarly, mounting or positioning device 504 in a plane parallel to table 510 fixes the device 504 in the third dimension. Thus, only two dimensional (e.g., x/y) control may be required for testing, which may provide speed, accuracy, and force profile control improvements over conventional three dimensional apparatus. Additionally, fixing the two devices in the third dimension may simplify coordinate system mapping between the apparatus 500 and the device 504 to a two dimensional x-y translation, rotation, and scaling. Apparatus 500 may be mounted to the supporting structure using, for example, fastener 580. Apparatus 500 may be fabricated from a number of layers including, for example, PCB 560, PCB 550, PCB 540, and PCB 530. The layers may be connected and held in stable relative positions using, for example, supports 590 and 592 and fasteners 582, 584, 586, and 588. While two supports and four fasteners are illustrated, a greater or lesser number of supports or fasteners may be employed. Similarly, while four PCBs are illustrated, a greater or lesser number may be employed. In one embodiment, the four PCBs may be cut from a single manufactured PCB.

A top layer (e.g., PCB 530) may include an aperture 532 to allow light to pass from the device under test 504 to a camera 502. The camera 502 may be used by a closed loop vision system to perform calibration, registration, and other actions. Camera 502 may be connected to apparatus 500 using, for example, camera support 505.

Portions of PCB 530, PCB 540, and PCB 550 have been cut away so that probe 534, grounding pad 522, C clip 536, and solenoid 570 can be seen. Solenoid 570 may be controlled to extend or retract probe 534. Retracting probe 534 may be sped or otherwise aided using spring 520. Solenoid 570 may be, for example, a push type solenoid. While a solenoid 570 is illustrated, other apparatus configured to push probe 534 into the touch interface may be employed. For example, a linear servo may be employed. Since the device under test 504 has a capacitive touch interface, the probe 534 is in contact with a grounding pad 522 that electrically grounds the probe 534. In one embodiment, the grounding pad 522 may be a gold plated circular ring. Other grounding pads may be employed. C clip 536, spring 520, and grounding pad 522 may all participate in grounding the probe 534. For example, spring 520 may provide a grounding path from C clip 536 to grounding pad 522.

Solenoid 570 may be controlled, at least in part, by logic 512 or circuit 514. While a single logic 512 is illustrated, multiple logics may be positioned in apparatus 500 in different locations. Similarly, while a single circuit 514 is illustrated, multiple circuits may be positioned in apparatus 500 in different locations. In one embodiment, solenoid 570 may be controlled using digital pulse width modulation (PWM). PWM may be used to control when and how the probe 534 is extended and retracted. In one embodiment, once probe 534 is extended, PWM may no longer be used to maintain the probe 534 in the extended position. Instead, a hold signal may be employed. Using the hold signal instead of using PWM control, where the hold signal may be a current or voltage or other indicator on a line or circuit, may free resources in a logic, circuit, computer or other device that is providing the PWM control for or to apparatus 500.

Apparatus 500 may be configured to communicate with other devices. For example, apparatus 500 may be configured to communicate with a computer. The computer may control the test to be performed by apparatus 500, may record the results of testing performed by apparatus 500, may display results or other information, or perform other roles. In one embodiment, apparatus 500 may include a connector 516 configured to connect apparatus 500 to another device. In another embodiment, apparatus 500 may communicate via wireless communication with another device. Connector 516 may be, for example, a Universal Serial Bus (USB) connector or other connector. In one embodiment, connector 516 may be configured to connect apparatus 500 with the device under test 504. In this embodiment, control signals, data, and other computer or electronic communications may flow between device under test 504 and apparatus 500. The device under test 504 may be configured with a connector similar to connector 516.

In one embodiment, logic 512 may provide digital PWM to analog actuators for force and speed control. In one embodiment, logic 512 may provide a dedicated channel for hold current to reduce software overhead. Once digital PWM has been used to extend probe 534, apparatus 500 may be configured to use less than 100% of the current used to move the probe 534 to keep probe 534 in the touch position. Circuit 514 may instead provide a smaller "hold" current (e.g., 25% of "extend" current).

Figure 6:
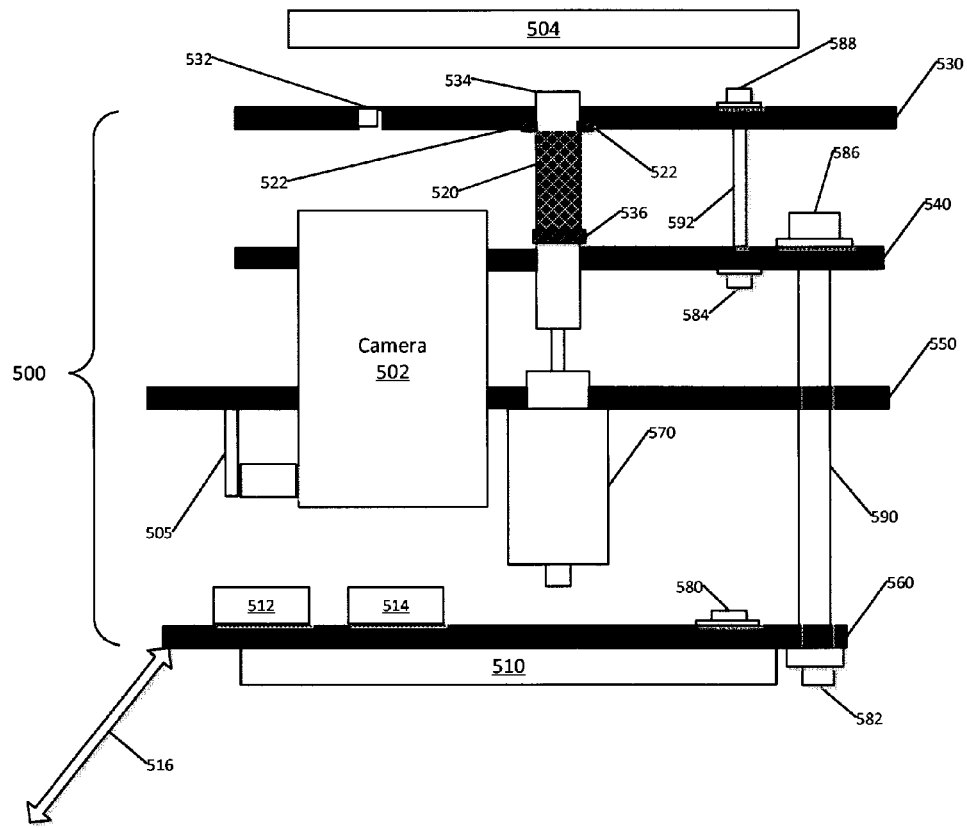
FIG. 6 illustrates a side view of a portion of an example apparatus configured to perform multi-touch testing of a capacitive touch interface.

FIG. 6 illustrates a side view of a portion of the example apparatus 500 with the probe 534 retracted. Probe 534 may have been retracted by gravity or with the help of spring 520. In one example, apparatus 500 may communicate with device under test 504 concerning a test to be performed. Apparatus 500 may have a pre-existing test for an interface to be displayed by the device under test 504. Additionally, the device under test 504 may know which interface is being tested and may have a built in test or tests for testing the interface. The device under test 504 may select the test for the interface or the apparatus 500 may select the test for the interface. Once a test is selected, the device under test 504 may communicate the test to the apparatus 500 or the apparatus 500 may communicate the test to the device under test 504. Once the test is in progress, the device under test 504 may report on whether and when certain keys, icons, and GUI elements are touched. The device under test 504 also knows where keys, icons, and other GUI elements are located on device under test 504 and whether the keys, icons, and other GUI elements have been touched. Thus, the device under test 504 may report what actually got touched to the apparatus 500. Either the device under test 504 or the apparatus 500 may "keep score" of how accurately the keys, icons, and GUI elements are being touched.

In one configuration, example apparatus and methods may provide a touch rate of 7 touches per second with ½ pixel accuracy, where a pixel measures approximately 0.1 mm. In another configuration, example apparatus and methods may provide a touch rate of 10 touches per second with 2-3 pixel accuracy, where a pixel measures approximately 0.1 mm.

Apparatus 500 is illustrated with multiple layers fabricated from offset printed circuit board construction for mechanical/structural integrity. The multiple layers may be machined to tolerances that facilitate supporting and guiding probe 534 without requiring an additional bearing or bushing. In effect, the multiple layers may serve as the bearings for the actuators or the probes. A bearing refers to a machine element that constrains relative motion between moving parts to only a desired motion. The bearings provided by the holes in the multiple layers provide free linear movement of the actuators or touch probes and prevent other motion by the actuators or touch probes. The holes in the multiple layers may provide a plain bearing by providing just a bearing surface with no additional rolling elements. The actuator or probe may be considered the journal (e.g., shaft in contact with bearing) that slides over the bearing surface.

In one embodiment, camera 502, logic 512, circuit 514, or another logic or circuit may provide a vision system for closed loop position control. Having the closed loop position control and the vision system removes issues associated with requiring knowledge of the size, position, or orientation of the device under test 504. The closed loop position control and vision system facilitate operating the apparatus 500 in the pixel space of the device under test 504. In one embodiment, so long as the resolution (e.g., 720×1024) of the device under test 504 is known, the apparatus 500, through the vision system and closed loop position control, can discover, calibrate, and register the capacitive touch interface on the device under test 504. The vision system and the closed loop position control allow the apparatus 500 to determine information including the size of the capacitive touch screen associated with the device under test 504 and the orientation of the device under test 504. Both the apparatus 500 and the device under test 504 may have a native co-ordinate system. The vision system and the closed loop position control facilitate mapping the native co-ordinate systems to each other, which in turn allows the apparatus 500 to work in the pixel space of the device under test 504.

Figure 7:
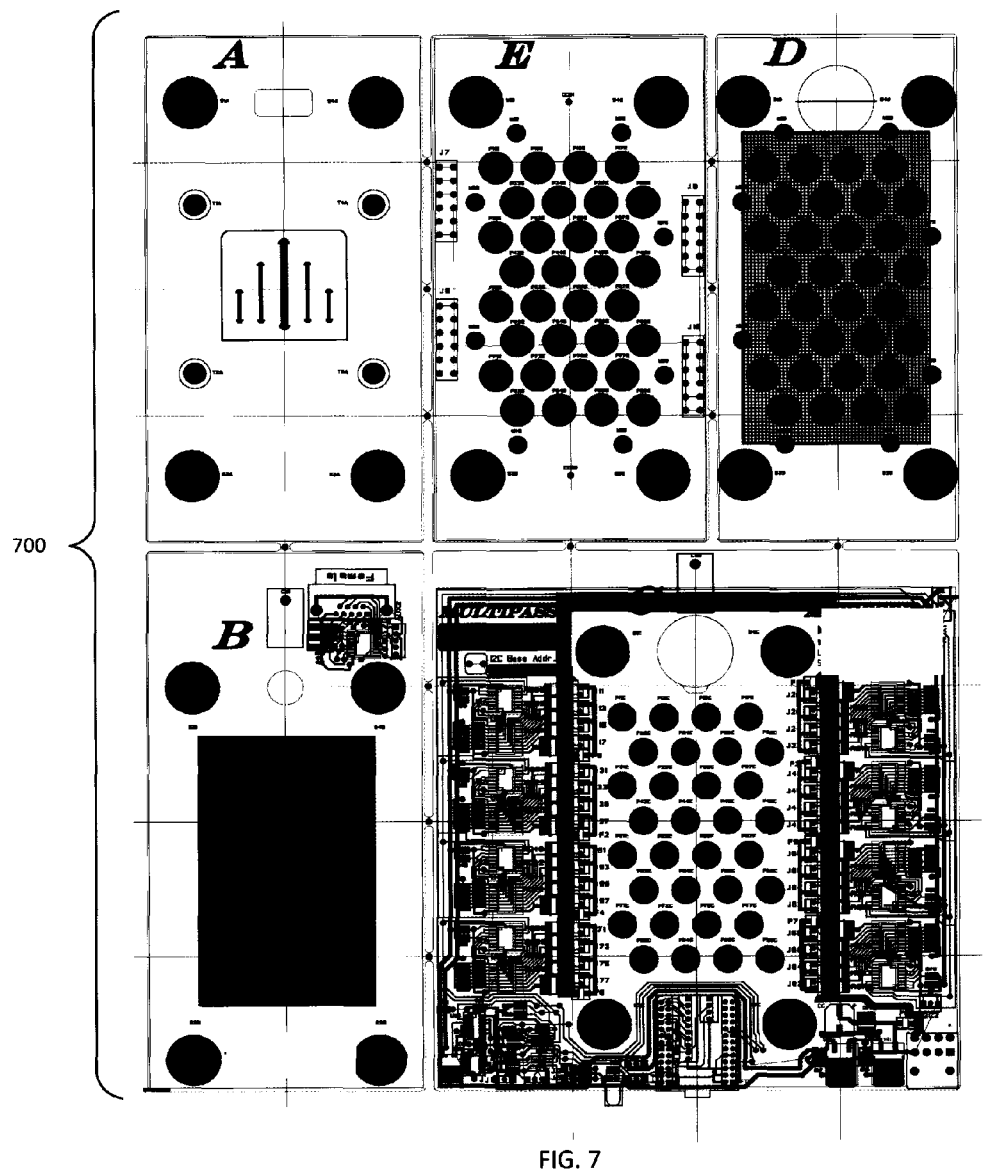
FIG. 7 illustrates a single printed circuit board from which layers of an example apparatus can be acquired.

FIG. 7 illustrates an example PCB 700 from which layers for an example apparatus can be taken. While five layers are illustrated, a greater or lesser number of layers may be employed. Similarly, while a single PCB 700 is illustrated a greater number of PCBs may be employed.

Figure 8:
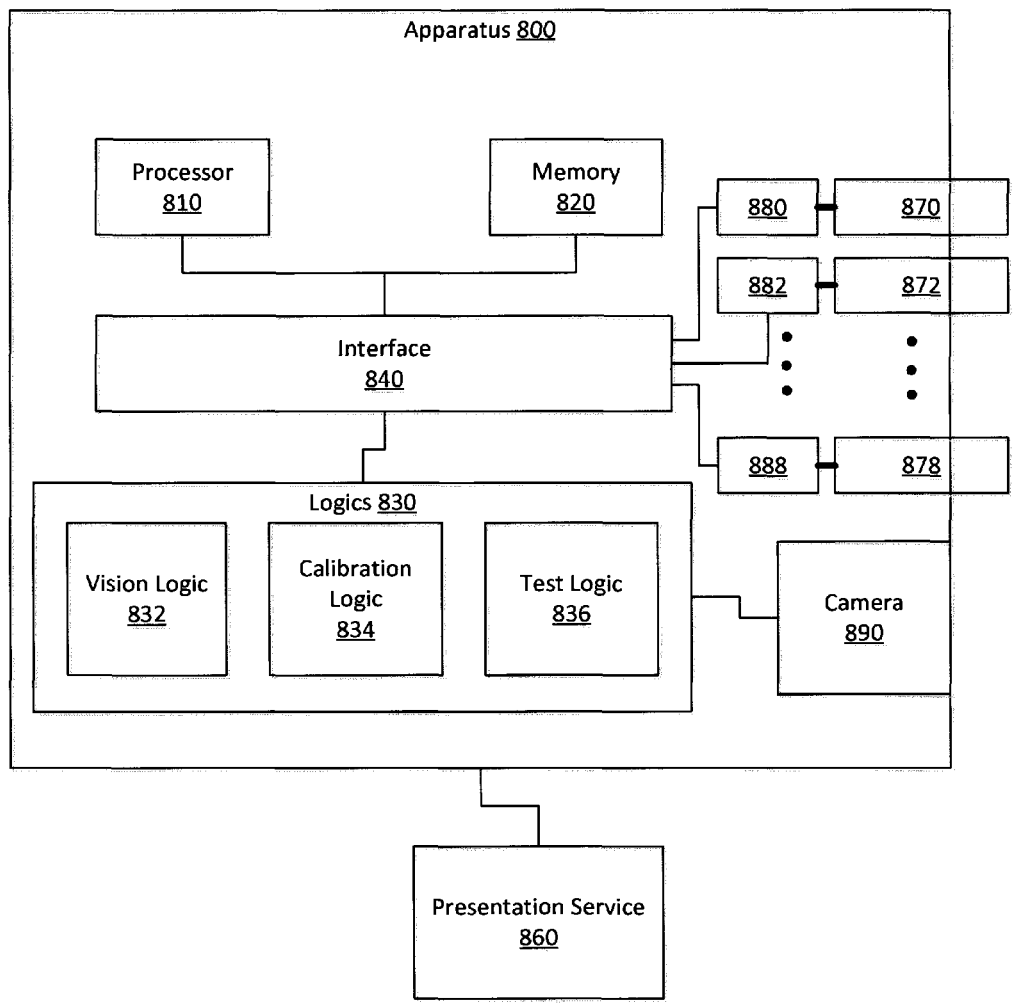
FIG. 8 is a block diagram that illustrates functional blocks representing portions of an example apparatus for performing multi-touch testing of a capacitive touch interface.

FIG. 8 illustrates an example apparatus 800 for performing touch testing of a capacitive touch interface. Apparatus 800 includes a processor 810, a memory 820, a set 830 of logics, and an interface 840 that connects the processor 810, the memory 820, and the set 830 of logics. The set 830 of logics may be configured to control touch testing of the capacitive touch screen using two or more probes.

Apparatus 800 also includes two or more probes (e.g., probes 870, 872, . . . 878) that are configured to extend and retract from the apparatus 800. The two or more probes may be configured to produce a capacitive touch response on a capacitive touch screen upon touching the capacitive touch screen. The two or more probes may be arranged in a honeycomb pattern that minimizes the amount of two dimensional (e.g., x/y) travel needed to position a probe with respect to a desired point on the capacitive touch screen. In one embodiment, the honeycomb pattern is configured so that a probe is equidistant from all other adjacent probes.

The apparatus 800 may also include two or more actuators (e.g., actuators 880, 882, . . . 888) that are configured to move multiple probes to produce touches on the capacitive touch interface. In different embodiments, a single assembly may include an actuator and a probe, or actuators and probes may be in separate assemblies.

In one embodiment, apparatus 800 may include a general purpose computer that has been transformed into a special purpose computer through the inclusion of the set 830 of logics. Apparatus 800 may interact with other apparatus, processes, and services through, for example, a computer network.

Apparatus 800 also includes a camera 890 or an image sensor. Different types of cameras or image sensors that are suitable for detecting light from a capacitive touch interface may be employed. The camera 890 is configured to provide images or other data to vision logic 832 or to calibration logic 834.

The set 830 of logics may include a vision logic 832 that is configured to provide a closed loop vision control system for controlling the position of the capacitive touch screen relative to the apparatus 800. The closed loop vision control system may provide control signals to an x/y positioning apparatus. The control signals may be a function of light detected by the camera 890 from the capacitive touch interface. The control signals may also be a function of a test being performed by the apparatus 800.

The set 830 of logics may also include a calibration logic 834 that is configured to calibrate a co-ordinate system associated with the apparatus 800 and a co-ordinate system associated with the capacitive touch screen. The calibration logic 834 is configured to perform the calibration independent of the original position or orientation of the capacitive touch screen. In one embodiment, the calibration logic 834 may be configured to calibrate the apparatus 800 according to a dual-color, split-screen, binary search approach configured to minimize calibration time. An example calibration scheme is described in connection with FIGS. 10 and 11. The calibration logic 834 may be configured to map the pixel co-ordinate system of the apparatus 800 to different pixel co-ordinate systems of different devices.

The set 830 of logics may also include a test logic 836 that is configured to control the two or more probes to test the capacitive touch screen. Testing may be performed by causing the two or more probes to produce a series of touches, multi-touches, or gestures on the capacitive touch interface. The series may include, for example, a known string of letters, a known string of numbers, a combination of letters or numbers, or touches intended to produce icons or other graphical user elements on a touch interface. Different interfaces and different devices may be tested with different series. In one embodiment, the test logic 836 may be configured to control the two or more probes to touch the capacitive touch screen at least ten times per second with two pixel accuracy.

In one embodiment, the test logic 836 may be configured to control extending the two or more probes using digital pulse width modulation (PWM). Test logic 836 may use digital PWM to individually control both the speed at which a probe extends and the force applied by the extended probe to the capacitive touch screen. While PWM is described controlling the speed and force applied, the control may be indirect. The PWM may control the power input. The power generates an electromotive force that depends on the instantaneous actuator position. The net force on the actuator includes the position dependent electromotive force, gravity, friction, and a position dependent spring compression force. The acceleration may then be defined by Newton's Law: $A=F(net)/m$. The velocity is equal to the time integral of the acceleration. Thus, the PWM controls the power input which in turn produces an electromotive force and the speed and force depend, at least in part, on the electromotive force. In one embodiment, movement time is balanced against momentum or energy of impact. Once the probe makes contact, test logic 836 may control the force with a resolution of 1% full scale and an accuracy of 5%. The test logic 836 may also be configured to control an actuator to press a probe into the capacitive touch interface with a force profile within a desired tolerance. The test logic 836 may also be configured to control an extended probe to remain extended using a hold signal. In one embodiment, the hold signal will not be a digital PWM signal.

In one embodiment, the test logic 836 may also be configured to communicate an interface test between the apparatus 800 and a device that receives signals from the capacitive touch screen. For example, the test logic 836 may be configured to receive an incoming interface test from the device or to provide an outgoing interface test to the device. The test logic 836 may be configured to establish the incoming interface test or the outgoing interface test as the interface test.

In one embodiment, the test logic 836 may also be configured to receive a touch report from a device (e.g., computer) that receives signals from the capacitive touch screen and to provide a test result based, at least in part, on the interface test and the touch report.

In different embodiments, some processing may be performed on the apparatus 800 and some processing may be performed by an external service or apparatus. Thus, in one embodiment, apparatus 800 may also include a communication circuit that is configured to communicate with an external source to facilitate collaborative testing, displaying results, dynamically adapting a test in progress, or other actions. In one embodiment, the apparatus 800 may interact with a presentation service 860 to facilitate displaying data using different presentations for different devices.

Some portions of the detailed descriptions that follow are presented in terms of algorithms and symbolic representations of operations on data bits within a memory. These algorithmic descriptions and representations are used by those skilled in the art to convey the substance of their work to others. An algorithm is considered to be a sequence of operations that produce a result. The operations may include creating and manipulating physical quantities that may take the form of electronic values. Creating or manipulating a physical quantity in the form of an electronic value produces a concrete, tangible, useful, real-world result.

It has proven convenient at times, principally for reasons of common usage, to refer to these signals as bits, values, elements, symbols, characters, terms, numbers, and other terms. It should be borne in mind, however, that these and similar terms are to be associated with the appropriate physical quantities and are merely convenient labels applied to these quantities. Unless specifically stated otherwise, it is appreciated that throughout the description, terms including processing, computing, and determining, refer to actions and processes of a computer system, logic, processor, or similar electronic device that manipulates and transforms data represented as physical quantities (e.g., electronic values).

Example methods may be better appreciated with reference to flow diagrams. For simplicity, the illustrated methodologies are shown and described as a series of blocks. However, the methodologies may not be limited by the order of the blocks because, in some embodiments, the blocks may occur in different orders than shown and described. Moreover, fewer than all the illustrated blocks may be required to implement an example methodology. Blocks may be combined or separated into multiple components. Furthermore, additional or alternative methodologies can employ additional, not illustrated blocks.

Figure 9:
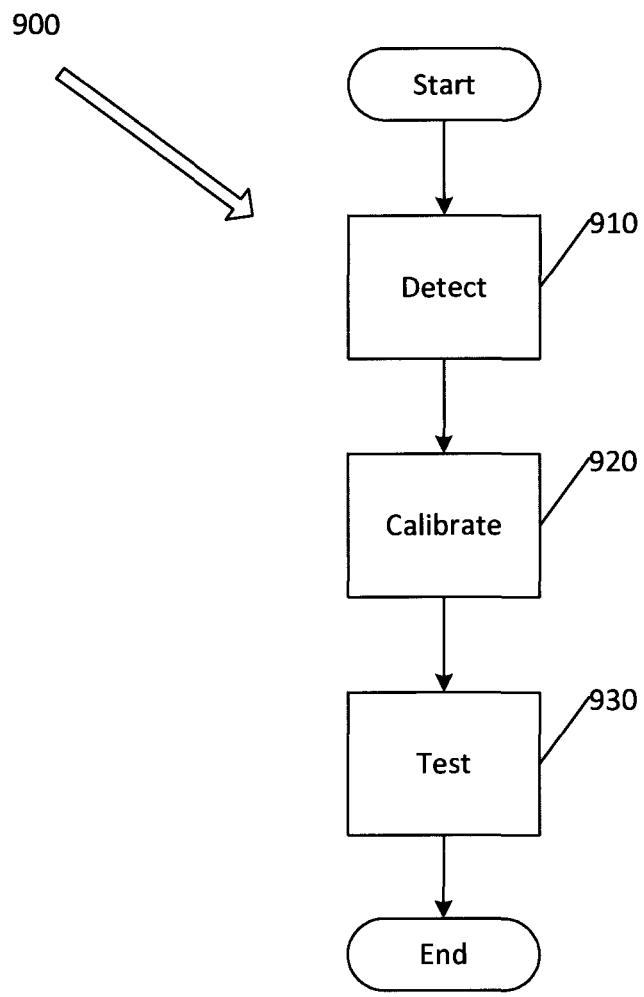
FIG. 9 illustrates an example method for performing multi-touch testing of a capacitive touch interface.

FIG. 9 illustrates an example method 900 associated with a multi-touch probe actuator. In different examples, method 900 may be performed on a single device, may be performed partially or completely in the cloud, may be performed on distributed co-operating devices, or may be performed other ways. In different examples, method 900 may be performed on devices including, but not limited to, a computer, a laptop computer, a tablet computer, an MP3 player, a phone, and a smart phone.

Method 900 includes, at 910, controlling a multi-probe capacitive touch interface tester to detect a capacitive touch interface to be tested. In one embodiment, detecting the capacitive touch interface includes detecting, in a camera associated with the tester, light associated with the capacitive touch interface.

Method 900 also includes, at 920, calibrating the tester with respect to the capacitive touch interface. In one example, calibrating the tester includes analyzing light associated with the capacitive touch interface to establish a spatial relationship between the tester and the interface. The calibration may proceed until the spatial relationship is sufficient to map the pixel co-ordinate system of the tester to the pixel co-ordinate system of the interface to a degree that allows the tester to operate in the pixel space of the interface. One example calibration scheme is described in connection with FIGS. 10 and 11.

Method 900 also includes, at 930, controlling the tester to test the capacitive touch interface at a rate of over ten touches, multi-touches or gestures per second in an order controlled by the test plan and at locations controlled by the test plan. The gestures may include, for example, a drag, a flick, a hold, a tap, a double tap, a pinch, an expand, or other gestures. Testing the capacitive touch interface may include acts including, but not limited to, determining whether an interface is reporting a number of touches or gestures accurately, determining whether an interface is reporting the location of touches or gestures accurately, determining whether an interface is responding appropriately to a touch or gesture, determining whether an interface is distinguishing between touches or gestures appropriately, and other actions. Some tests may be more hardware-centric, some tests may be more software-centric, and yet other tests may address both hardware and software aspects.

In one example, a method may be implemented as computer executable instructions. Thus, in one example, a computer-readable storage medium may store computer executable instructions that if executed by a machine (e.g., computer) cause the machine to perform methods described or claimed herein including method 900. While executable instructions associated with the above methods are described as being stored on a computer-readable storage medium, it is to be appreciated that executable instructions associated with other example methods described or claimed herein may also be stored on a computer-readable storage medium. In different embodiments the example methods described herein may be triggered in different ways. In one embodiment, a method may be triggered manually by a user. In another example, a method may be triggered automatically.

"Computer-readable storage medium", as used herein, refers to a medium that stores instructions or data. "Computer-readable storage medium" does not refer to propagated signals. A computer-readable storage medium may take forms, including, but not limited to, non-volatile media, and volatile media. Non-volatile media may include, for example, optical disks, magnetic disks, tapes, flash memory, and other media. Volatile media may include, for example, semiconductor memories (such as RAM, SRAM etc.), dynamic memory (such as DRAM), and other media. Common forms of a computer-readable storage medium may include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

Figure 10:
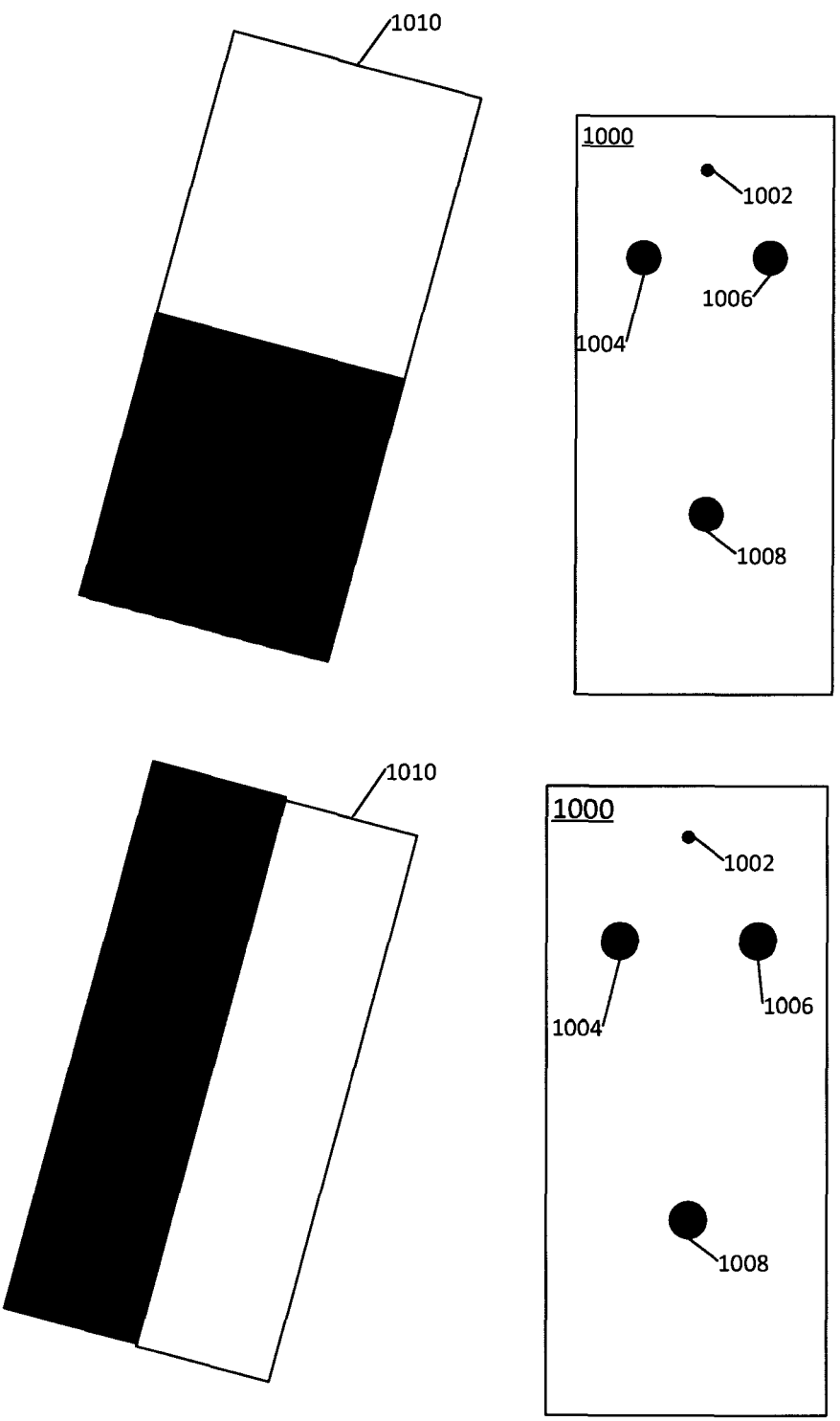
FIG. 10 illustrates aspects of an example calibration scheme.

FIG. 10 illustrates aspects of an example calibration scheme. The calibration scheme may be referred to as a dual-color, split-screen, binary search approach. A device to be tested may have a screen 1010. The calibration scheme may calibrate the screen 1010 and the apparatus 1000. Apparatus 1000 has an aperture 1002 through which light may pass from the screen 1010 to a camera, vision system, and calibration logic associated with apparatus 1000. Apparatus 1000 also has a number of holes, three of which are illustrated (e.g., holes 1004, 1006, 1008). Apparatus 1000 may have a greater number of holes. The distance between aperture 1002 and holes 1004, 1006, and 1008 may be known with great precision. One goal of the example calibration scheme is to make it possible to quickly, precisely, and accurately extend a probe through a hole to touch screen 1010 at a desired location.

Before a probe can be controlled to extend and touch a precise location, a relationship between the coordinate space for screen 1010 and apparatus 1000 must be determined. A first step in calibrating screen 1010 and apparatus 1000 is positioning screen 1010 over apparatus 1000. For this first positioning, screen 1010 may be illuminated and relative motion may be produced between screen 1010 and apparatus 1000 until light from screen 1010 passes through the aperture 1002 and is detected by apparatus 1000. Once the screen 1010 has been detected, a dual color, split-screen, binary search approach may be employed to find a desired location on the screen 1010. In one embodiment, the desired location may be the center of screen 1010.

The top portion of FIG. 10 illustrates screen 1010 split in half, with the top half being a first color (e.g., red) and the bottom half being a second color (e.g., green). Apparatus 1000 may know which half of the screen 1010 is supposed to be the first color and which half is supposed to be the second color. Apparatus 1000 may find the middle of screen 1010 by producing relative motion until the camera detects that half of the light coming through aperture 1002 is the first color and half of the light is the second color. This position would exist at the location where the first color changes to the second color. In one embodiment, the position may be moved without moving either the apparatus 1000 or the screen 1010. In this embodiment, the screen 1010 may alter the split-screen pattern displayed on the screen 1010 until the location where the colors change is detected. In one embodiment, a binary search may be employed to control moving the screen 1010 until the line is found. For example, the complete amount of travel available in the desired direction may be known. The apparatus 1000 may control relative motion between the screen 1010 and the apparatus 1000 for half of the available amount of travel. If the color of light coming through the aperture is still the same, then the travel distance may be halved, the travel direction may remain the same, and relative motion caused again. If the color of light coming through the aperture changed, then the travel distance may also be halved, the travel direction may be changed, and the relative motion caused again. This approach will quickly converge on the line separating the two colors. Once the line has been found, the center of the screen 1010 is known in one direction.

The approach may then be repeated in the other dimension as illustrated in the lower portion of FIG. 10. When the line in the other dimension is found, apparatus 1000 will have certain knowledge about one true point on screen 1010. When screen 1010 was split in half in both dimensions as illustrated in FIG. 10, that one true point will be the center of screen 1010. The dual-color, split-screen, binary search approach could then be employed to find other true points on the screen 1010 by splitting the screen 1010 in ways other than in half.

Figure 11:
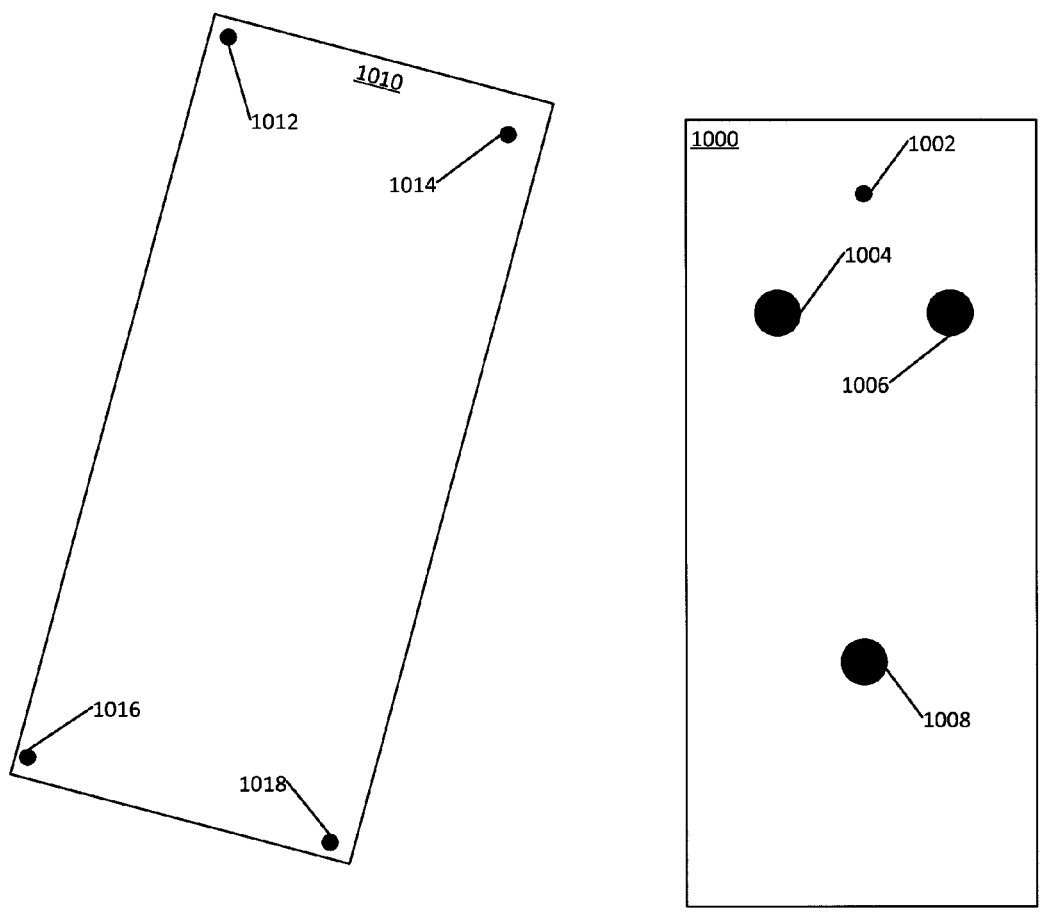
FIG. 11 illustrates aspects of an example calibration scheme.

FIG. 11 illustrates additional aspects of an example calibration scheme. In one embodiment, the approach in FIG. 11 may supplement the approach described in connection with FIG. 10. In FIG. 11, four corner pixels on screen 1010 are illuminated. The corner pixels 1012, 1014, 1016, and 1018 could be illuminated one at a time, and the apparatus 1000 could control relative motion to occur between screen 1010 and apparatus 1000 until the illuminated pixels are discovered. To facilitate more quickly locating a corner pixel, information concerning the size of a pixel on the device being tested may first be acquired. For example, a pattern may be displayed at the one true point known to apparatus 1000. This pattern may facilitate determining the size of a pixel displayed by screen 1010. When the pixel size is known, and when the screen resolution is known, the approximate location of a corner pixel may be determined and the search for the corner pixel may begin in that approximate location. Different approaches for finding corner pixels may be employed. Additionally, pixels other than corner pixels may be located.

Regardless of whether the dual-color, split-screen, binary search approach of FIG. 10 and/or the corner finding approach of FIG. 11 are employed, the calibration scheme is configured to produce an accurate mapping between the co-ordinate systems of the apparatus 1000 and the screen 1010. Being able to map the two co-ordinate systems allows the apparatus 1000 to operate in the pixel-space of the screen 1010, which in turn facilitates testing different interfaces on different devices using a single tester. Once the two co-ordinate systems are mapped, then apparatus 1000 can control x/y positioning apparatus using the mapping and the information known about the locations of holes 1004, 1006, 1008 and other holes to determine how to quickly and accurately move screen 1010 to align a probe with a desired location to touch on screen 1010.

In general, the calibration scheme may find the screen to test by illuminating the screen and detecting the illumination using a camera on the apparatus. The scheme may then find the center of the device. The scheme may then determine a rough scale of the width or height of the screen based on pre-established information about the screen resolution and determined information about pixel size. The scheme may then illuminate and find specific points (e.g., four corner points) to determine the orientation of the screen. With the center, pixel size, and corner point information available, the scheme may perform a two dimensional (e.g., x/y) translation, rotation, and scaling using, for example, linear algebra, to map the coordinate system of the screen to the coordinate system of the apparatus.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Data store", as used herein, refers to a physical or logical entity that can store data. A data store may be, for example, a database, a table, a file, a list, a queue, a heap, a memory, a register, and other physical repository. In different examples, a data store may reside in one logical or physical entity or may be distributed between two or more logical or physical entities.

"Logic", as used herein, includes but is not limited to hardware, firmware, software in execution on a machine, or combinations of each to perform a function(s) or an action(s), or to cause a function or action from another logic, method, or system. Logic may include a software controlled microprocessor, a discrete logic (e.g., ASIC), an analog circuit, a digital circuit, a programmed logic device, a memory device containing instructions, and other physical devices. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the Applicant intends to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus configured to touch test a device having a capacitive touch interface, comprising:
    a plurality of touch probes;
    a plurality of actuators configured to move members of the plurality of touch probes to produce touches on the capacitive touch interface;
    a two dimensional positioning logic configured to control a two dimensional positioning apparatus to produce relative motion between the apparatus and the device in two dimensions;
    a camera configured to detect light associated with the capacitive touch interface;
    a vision system configured to provide closed loop position control for the two dimensional positioning apparatus based on light detected by the camera from the capacitive touch interface;
    a calibration logic configured to establish a spatial relationship between the apparatus and the device and to map a pixel co-ordinate system of the apparatus to a pixel co-ordinate system of the device to facilitate having the apparatus operate in the pixel space of the device, and
    a test logic configured to test the device by producing a programmed series of touches on the capacitive touch interface according to an interface test.

2. The apparatus of claim 1, the test logic being configured to control the two dimensional positioning logic and members of the plurality of actuators to cause members of the plurality of touch probes to produce gestures on the capacitive touch interface at locations controlled by the interface test.

3. The apparatus of claim 1, the test logic being configured to control the two dimensional positioning logic and members of the plurality of actuators to cause members of the plurality of touch probes to produce multi-touches on the capacitive touch interface, where the members of the plurality of touch probes produce the multi-touches at locations controlled by the interface test.

4. The apparatus of claim 1, the test logic being configured to control the apparatus to produce at least seven touches per second with half pixel accuracy.

5. The apparatus of claim 1, the test logic being configured to control the apparatus to produce at least ten touches per second with two pixel accuracy.

6. The apparatus of claim 1, the test logic being configured to use digital pulse width modulation to control an individual member of the plurality of actuators to extend, where extending the individual member causes a corresponding member of the plurality of touch probes to come into contact with the capacitive touch interface.

7. The apparatus of claim 6, where the digital pulse width modulation individually controls both the speed at which the individual member extends and a force applied by the individual member to the corresponding member.

8. The apparatus of claim 6, the test logic being configured to control the individual member to remain extended using a hold signal, where the hold signal is not a digital pulse width modulation signal.

9. The apparatus of claim 1, where the plurality of touch probes are arranged in a pattern that minimizes the amount of two dimensional travel needed to position a member of the plurality of touch probes with respect to a desired point on the device.

10. The apparatus of claim 9, where the pattern is a honeycomb pattern in which a member of the plurality of touch probes is equidistant from all other adjacent members of the plurality of touch probes.

11. The apparatus of claim 1, the calibration logic being configured to calibrate the apparatus according to a dual-color, split-screen, binary search approach configured to minimize the amount of time required to establish the spatial relationship between the apparatus and the device.

12. The apparatus of claim 1, the calibration logic being configured to map the pixel co-ordinate system of the apparatus to different pixel co-ordinate systems of different devices.

13. The apparatus of claim 1, the calibration logic being configured to map the pixel co-ordinate system of the apparatus to the pixel co-ordinate system of the device independent of the original position or orientation of the device.

14. The apparatus of claim 1, where the apparatus is constructed from a plurality of layers, where the plurality of layers are fabricated on a single printed circuit board.

15. The apparatus of claim 14, where two members of the plurality of layers include a first plurality of holes that are configured to function as bearings for the members of the plurality of actuators, and where two members of the plurality of layers are configured with a second plurality of holes that are configured to function as bearings for members of the plurality of touch probes.

16. The apparatus of claim 1, the test logic being configured to control a member of the plurality of actuators to press a member of the plurality of touch probes into the capacitive touch interface with a force profile within a tolerance of one percent full scale with five percent accuracy.

17. The apparatus of claim 1, the test logic being configured to receive an incoming interface test from the device or to provide an outgoing interface test to the device, and where the test logic is configured to establish the incoming interface test or the outgoing interface test as the interface test.

18. The apparatus of claim 1, where the apparatus is configured to receive a touch report from the device and where the apparatus is configured to correlate the touch report to the interface test.

19. A computer-readable storage medium storing computer-executable instructions that when executed by a computer control the computer to perform a method, the method comprising:
    controlling a multi-probe capacitive touch interface tester to detect a capacitive touch interface to be tested, where detecting the capacitive touch interface includes detecting, in a camera associated with the tester, light associated with the capacitive touch interface;
    calibrating the tester with respect to the capacitive touch interface, where calibrating the tester includes analyzing light associated with the capacitive touch interface to establish a spatial relationship between the tester and the interface, where the spatial relationship is sufficient to map the pixel co-ordinate system of the tester to the pixel co-ordinate system of the interface to a degree sufficient to allow the tester to operate in the pixel space of the interface; and controlling the tester to test the capacitive touch interface at a rate of over ten touches, multi-touches or gestures per second in an order controlled by the test plan and at locations controlled by the test plan.

20. An apparatus, comprising:

two or more probes configured to extend and retract from the apparatus, the two or more probes being configured produce a capacitive touch response on a capacitive touch screen upon touching the capacitive touch screen, the two or more probes being arranged in a honeycomb pattern that minimizes the amount of two dimensional travel needed to position a probe with respect to a desired point on the capacitive touch screen, where the honeycomb pattern is configured so a probe is equidistant from all other adjacent probes;

two or more printed circuit board layers, where members of the two or more layers include a plurality of holes configured to function as bearings for the two or more probes;

a camera;

a processor;

a memory;

a set of logics configured to control touch testing of the capacitive touch screen using the two or more probes; and an interface to connect the processor, the memory, the camera, and the set of logics;

the set of logics comprising:

a vision logic configured to provide a closed loop vision system for controlling the position of the capacitive touch screen relative to the apparatus;

a calibration logic configured to calibrate a co-ordinate system associated with the apparatus and a co-ordinate system associated with the capacitive touch screen independent of the original position or orientation of the capacitive touch screen; and a test logic configured to control the two or more probes to test the capacitive touch screen by causing the two or more probes to produce a series of touches, multi-touches, or gestures on the capacitive touch interface, the vision logic being configured to provide the closed loop vision system based, at least in part, on light detected by the camera;

the calibration logic being configured to calibrate the apparatus according to a dual-color, split-screen, binary search approach configured to minimize the amount of time required to calibrate the apparatus, the test logic being configured:

to control the two or more probes to touch the capacitive touch screen at least ten times per second with two pixel accuracy, to control extending the two or more probes using digital pulse width modulation, where the digital pulse width modulation individually controls both the speed at which a probe extends and the force applied by the probe to the capacitive touch screen, to control an extended probe to remain extended using a hold signal, where the hold signal is not a digital pulse width modulation signal, to control the force applied by the probe to the capacitive touch screen during the touch to within a tolerance of one percent full scale and an accuracy of five percent, to communicate an interface test between the apparatus and a device that receives signals from the capacitive touch screen, and to receive a touch report from the device that receives signals from the capacitive touch screen and to provide a test result based, at least in part, on the interface test and the touch report.

* * * * *

UNITED STATES PATENT AND TRADEMARK OFFICE
CERTIFICATE OF CORRECTION

| | | |
|---|---|---|
| PATENT NO. | : 9,024,899 B2 | |
| APPLICATION NO. | : 13/802640 | |
| DATED | : May 5, 2015 | |
| INVENTOR(S) | : Rovito et al. | |

It is certified that error appears in the above-identified patent and that said Letters Patent is hereby corrected as shown below:

In the Claims:

Column 13, line 30, claim 1, delete "to detect light" and insert --to detect a light--.

Column 13, line 34, claim 1, delete "based on light detected" and insert --based on the light detected--.

Signed and Sealed this
Ninth Day of February, 2016

Michelle K. Lee
*Director of the United States Patent and Trademark Office*